(12) United States Patent
Lee et al.

(10) Patent No.: US 6,876,041 B2
(45) Date of Patent: Apr. 5, 2005

(54) ESD PROTECTION COMPONENT

(75) Inventors: Jian-Hsing Lee, Pu-Tzu (TW); Kuo-Reay Peng, Feng-Shan (TW); Shui-Hung Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 09/974,056

(22) Filed: Oct. 11, 2001

(65) Prior Publication Data

US 2003/0047786 A1 Mar. 13, 2003

(30) Foreign Application Priority Data

Jul. 9, 2001 (TW) .................................... 90116752 A

(51) Int. Cl.[7] .............................................. H01L 23/62
(52) U.S. Cl. ........................ 257/358; 257/357; 257/355
(58) Field of Search ................................. 257/355–363

(56) References Cited

U.S. PATENT DOCUMENTS

| | | | | |
|---|---|---|---|---|
| 3,712,995 A | * | 1/1973 | Steudel ...................... | 361/110 |
| 4,039,869 A | * | 8/1977 | Goldman et al. ........... | 327/566 |
| 4,656,491 A | * | 4/1987 | Igarashi ...................... | 257/362 |
| 5,326,994 A | * | 7/1994 | Giebel et al. ............... | 257/174 |
| 5,389,842 A | * | 2/1995 | Hardee ........................ | 327/391 |
| 5,576,557 A | * | 11/1996 | Ker et al. .................... | 257/173 |
| 5,714,796 A | * | 2/1998 | Chishiki ..................... | 257/544 |
| 5,742,085 A | | 4/1998 | Yu | |
| 6,072,219 A | * | 6/2000 | Ker et al. .................... | 257/355 |

* cited by examiner

*Primary Examiner*—Ori Nadav
(74) *Attorney, Agent, or Firm*—Birch, Stewart, Kolasch & Birch, LLP

(57) ABSTRACT

The present invention provides an ESD protection component, comprising at least two MOS field effect transistors (FETs) of a first conductivity type and a first well having a first conductivity type. The two MOS FETs have two parallel gates formed on a first semiconductive layer having a second conductivity type. The first well formed on the first semiconductive layer is comprised of a connecting area formed between the MOS FETs, two parallel extension areas formed perpendicular to the gates of the MOS FETs, and a first doping area of the second conductivity type formed in the connecting area. Two SCR are formed with drains of the MOS FETs, the first semiconductive layer, the first well and the first doping region. With the combination of the SCR and NMOS FET, ESD protection efficiency can be substantially enhanced.

4 Claims, 3 Drawing Sheets

ESD PROTECTION COMPONENT

BACKGROUND OF THE INVENTION

1. Field of the Invention

The present invention relates in general to an ESD protection component. In particular, the present invention relates to an ESD protection component combining metal oxide semiconductor field effect transistor(MOS FET) with semiconductor controlled rectifier (SCR).

2. Description of the Related Art

As technology advances, ESD durability has become an increasing concern for integrated circuit (IC) manufacture. As semiconductors have advanced into deep submicron regimes, the resulting scaled-down semiconductors, shallower doping junction depths, thinner gate oxide layers, lightly-doped-drain structures (LDD), shallow trench isolation (STI) and salicide processes are less tolerant stress. Therefore, special ESD protection circuits must be deliberately designed around the I/O port of the IC to prevent damage from ESD stress.

Normal ESD protection circuits have a parasitic npn bipolar junction transistor (BJT) in the output stage NMOS FET to release ESD stress. The output stage NMOS FET is usually strong enough to withstand strong current.

Alternatively, SCR formed across the I/O pad and the power line is used as the ESD protection component. Less heat is generated from the SCR due to its low holding voltage. The SCR thus endures high ESD stress and is a good ESD protection component. In conventional technology, NMOS FET is used to decrease the trigger voltage of the SCR. FIG. 1a shows a conventional NMOS triggered low-voltage SCR (NTLSCR). FIG. 1b shows a cross-section of a line aa' in FIG. 1a. The SCR is composed of a P+ doped region 64, an n-well 62, a p substrate 60 and an N+ doped region 66. Special attention is paid to the configuration of the NMOS FET and the SCR to obtain a smaller layout area with better ESD protection ability.

In U.S. Pat. No. 5,742,085, an NMOS FET is formed between two SCR. When the drain of the NMOS FET is broken down, both SCR are triggered simultaneously.

SUMMARY OF THE INVENTION

An object of the present invention is to provide an ESD protection component combining NMOS FET with SCR to achieve good ESD protection and small chip size.

The present invention provides an ESD protection component, comprising: at least two MOS field effect transistors (FETs) of a first conductivity type and a first well having a first conductivity type. The two MOS FETs have two parallel gates formed on a first semiconductive layer having a second conductivity type. The first well formed on the first semiconductive layer is comprised of: a connecting area formed between the MOS FETs; two parallel extension areas formed perpendicular to the gates of the MOS FETs; and a first doping area of the second conductivity type formed in the connecting area. Two SCR are formed with drains of the MOS FETs, the first semiconductive layer, the first well and the first doping region.

The difference between the present invention and a traditional LVTSCR are:

1. The ESD protection component of the present invention includes SCR and NFET devices simultaneously. The present invention thus can be used as an output driver, while the LVTSCR can only be an ESD protection device.
2. The N-well in the ESD protection component of the present invention is not connected with the drain of the NFET while that of the conventional LVTSCR is.
3. The ESD component of the present invention has two additional N-type doping areas (NW/N+ OD) at the top and bottom sides of the device (as notation 30 shown in FIG. 2a).
4. The ESD protection component in the present invention has a shunt N-well resistor between the N-type doping areas 30 and the P+ doping area (P+ OD/NW), as shown in FIG. 2a.
5. ESD protection devices are often designed with large width in vertical direction (as y in FIG. 1a) and small width in horizontal direction, in order to build a multi-finger device. For instance, the dimension of an NFEG drain is about 30 um*5 UM (y*x). The series resistor of N-well is about 1 k. If an shunt N-well resistor with 1 k is required, a distance of 30 um is required between the N+ OD and P+ OD in the conventional LVSTR while only about 5 um is required between the N-type doping areas and the P+ doping area for the ESD protection component of the present invention. Without an adequate shunt N-well resistor, the SCR cannot be turned on. Concluded from the description above, the distance between the N-type doping areas and the P+ doping area (to create an required N-well resistor) of the ESD protection component of the present invention is much smaller than that of a conventional LVSCR. In addition, the two N-doping areas 30 are located at the tope and bottom sides of the present invention. Thus, there is no need to increase the drain area of the NFET in order to create an adequate N-well resistor, while extra drain area needs to be created in the conventional LVTSCR.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention can be more fully understood by reading the subsequent detailed description in conjunction with the examples and references made to the accompanying drawings, which are given by way of illustration only, and thus are not limitative of the present invention, and wherein:

FIG. 1b shows a cross-section of a line aa' in FIG. 1a;

FIG. 2b is a cross-section of a line bb' in FIG. 2a; and

DETAILED DESCRIPTION OF THE PREFERRED EMBODIMENT

Figure 1A:
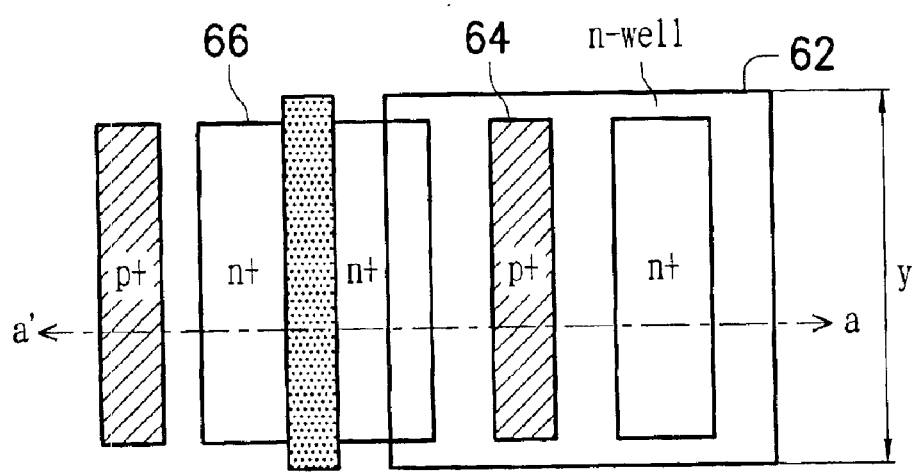
FIG. 1a shows a conventional NMOS triggered low-voltage SCR (NTLSCR)
Figure 1B:
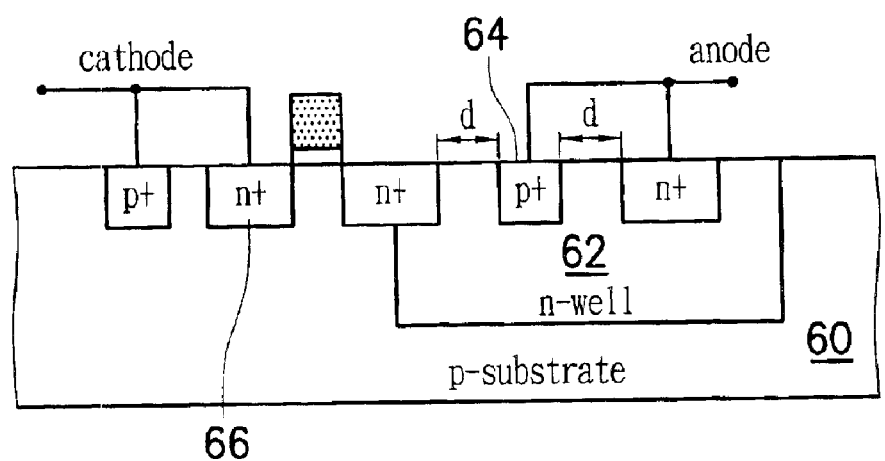
Figure 2A:
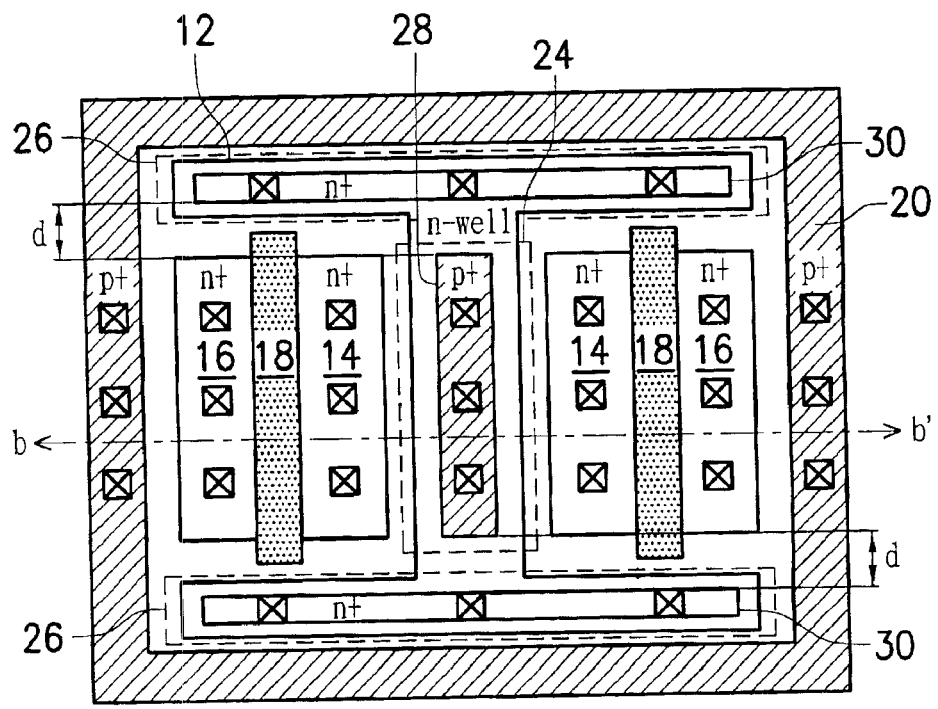
FIG. 2a is a schematic diagram of an ESD protection component of the present invention.
Figure 2B:
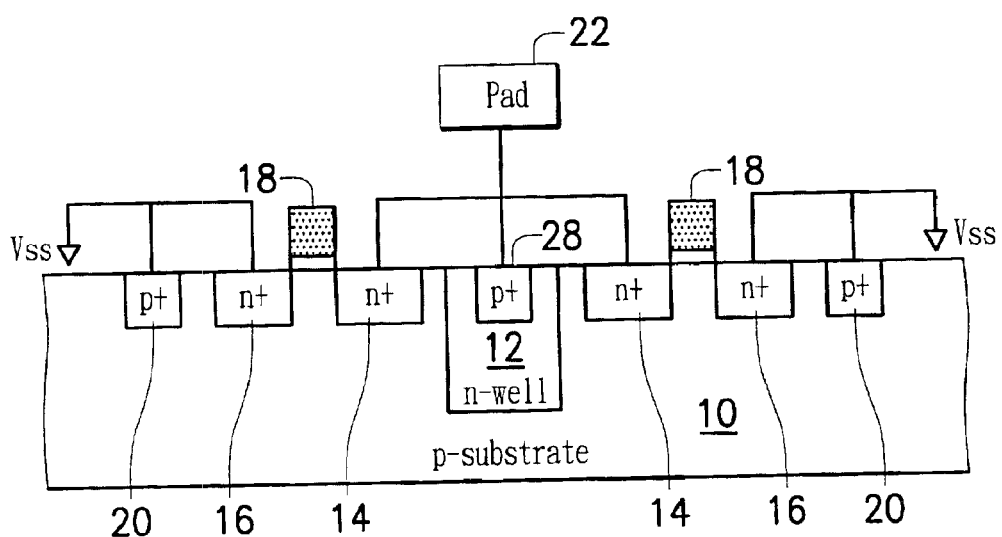

FIG. 2a is a top view of an ESD protection component of the present invention; FIG. 2b is the cross-section of a line bb' in FIG. 2a.

The ESD protection component comprises at least two NMOS FETs formed on a P substrate 10, as shown in FIGS.

2a and 2b. Each MOS FET has a gate 18, an n+ doped area 14 as a drain and another n+ doped area 16 as a source. The gates 18 are roughly parallel to an "I" shaped n well 12. The n well 12 is schematically divided into three sections, two are extension areas 26, formed in parallel and roughly perpendicular to the gate 18, as shown in FIG. 2a; the other is a connecting area 24, formed between the two n+ doped areas 14 and connecting the two extension areas 26. Each extension area 26 has an n-type doping area 30, as the connecting point of the n well 12. The connecting area 24 has a p+ doped area 28. Another p+ doping area, as a guard ring of the ESD protection component, surrounding the NMOS FET and the n well 12, is formed and becomes a connecting point of the p substrate 10.

The electric connection of the ESD protection component in FIGS. 2a and 2b is described below. The sources of the NMOS FETs (the n+ doped areas 16) are coupled to VSS, the p substrate 10 is coupled to VSS through the p+ doped area 20. The drains (the n+ doped areas 14) and the p+ doped area 28 are coupled to a pad 22. The n well 12 is coupled to the pad 22 through the n+ doped area 30 in the extension areas 26. The gates 18 are coupled to VSS, a pre-driver circuit or others, depending on the circuit design.

In FIG. 2b, two SCR connected in series between the pad 22 and VSS are formed. Each SCR is comprised of the p+ doped area 28, the n well 12, the p substrate 10 and an n+ doped area 16.

The drains of the NMOS FETs have low gate-added breakdown voltages so that they are easily broken down in an ESD event. Furthermore, the n well 12 is far from the connecting point of the pad 22 (the n+ doped area 30 in the extension area 26), so significant resistance is formed to reduce the voltage level of the n well 12 of the SCR which causes the SCR to be triggered much faster. The parasitic npn under the NMOS FETs also help to release the ESD current and increases the ESD protection efficiency of the ESD protection component.

The post-driver can be used as the NMOS FETs so no extra process is needed. In other words, only a little change is needed in the post-driver to implement the ESD protection component of the present invention.

The two NMOS FETs are formed in series to become a large finger-shaped NMOS FET. More NMOS FETs can be combined if necessary. The implementation can easily be performed by those skilled in the art and is thus not described here. It is worth noticing that when more than two NMOS FETs are used, the n well 12 may not have the "I" shape, but a "II" shape and so on.

Figure 3:
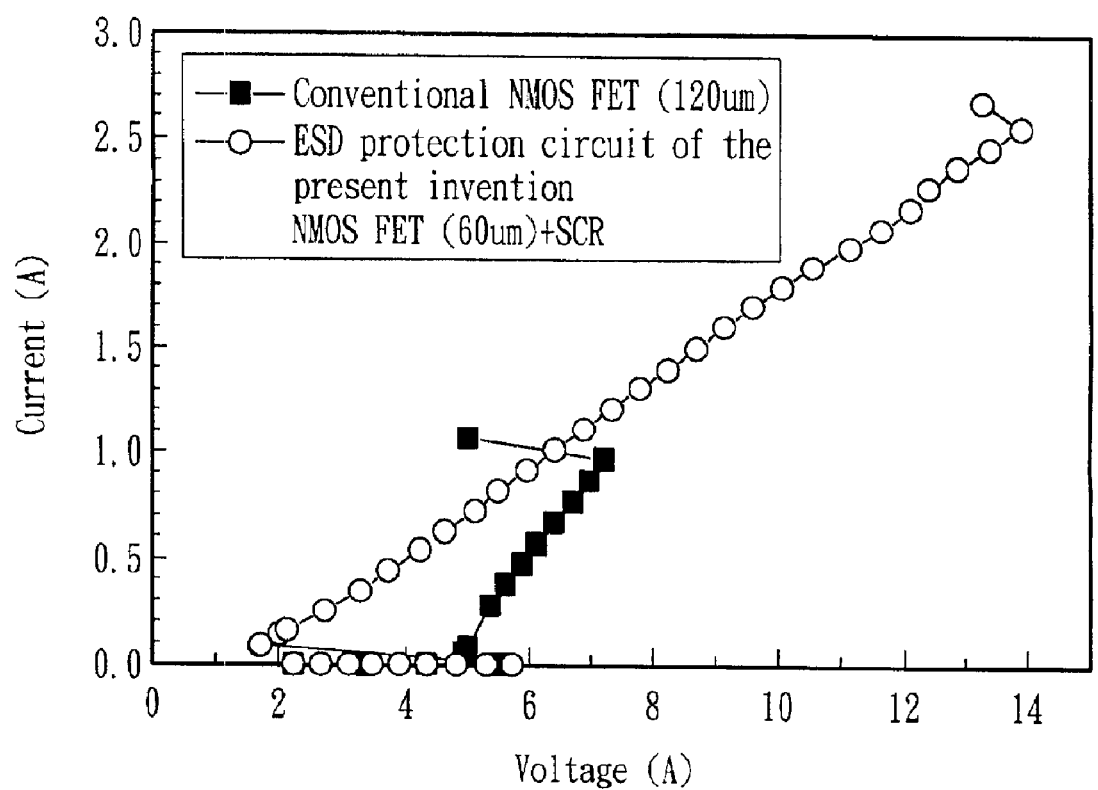
FIG. 3 shows an IV diagram of the ESD protection components of the prior art and the present invention.

FIG. 3 is an IV diagram of the ESD protection components of the prior art and the present invention. Table 1 is the comparison chart of the ESD protection efficiency of the conventional ESD protection component and the present invention. The conventional NMOS FET has a channel width of 120 micrometers, twice that of the ESD protection component of the present invention (with a channel width of 60 micrometers). Referring to FIG. 3 and Table 1, the conventional NMOS FET is larger, but its human body mode (HBM) ESD durability is only 1.5 KV, which does not meet the 2 KV market requirement. On the contrary, the ESD protection component of the present invention, using the NMOS FET and the SCR structures, only half of the conventional NMOS FET size, achieves an HBM ESD durability as high as 5 KV. In other words, the ESD protection component of the present invention is smaller, but achieves impressive ESD protection efficiency.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An ESD protection component, comprising:

at least two MOS field effect transistors (FETs) of a first conductivity type, having two gates and formed in parallel on a first semiconductive layer having a second conductivity type; and a first well having a first conductivity type, formed on the first semiconductive layer, comprising;

a connecting area, formed between the MOS FETs;

two parallel extension areas, formed perpendicular in plan view to the gates of the FETs, said gates being between said extension areas; and a first doping area of the second conductivity type, formed in the connecting area;

wherein each of the MOS FETs has a drain region of the first conductivity type, and the drain regions of the MOS FETs are commonly and directly connected to a single pad.

2. The ESD protection component as claimed in claim 1, wherein the first doping area is directly connected to the pad.

3. The ESD protection component as claimed in claim 1, wherein each of the MOS FETs has a source region of the first conductivity type, and the source regions of the MOS FETs are commonly and directly connected to a power rail.

4. The ESD protection component as claimed in claim 1, wherein the first well is electrically connected to the pad through the extension areas.

* * * * *